(12) United States Patent
Ajit et al.

(10) Patent No.: US 6,424,510 B1
(45) Date of Patent: Jul. 23, 2002

(54) ESD STRUCTURE FOR IC WITH OVER-VOLTAGE CAPABILITY AT PAD IN STEADY-STATE

(75) Inventors: Janardhanan S. Ajit, Sunnyvale; Hung Pham Le, San Jose, both of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/560,632

(22) Filed: Apr. 28, 2000

(51) Int. Cl.[7] ................................................. H02H 9/00
(52) U.S. Cl. ........................ 361/59; 361/91.1; 361/111; 361/127
(58) Field of Search ........................... 361/56, 91.1, 111, 361/117, 118, 127

(56) References Cited

U.S. PATENT DOCUMENTS 5,576,557 A * 11/1996 Ker et al. .................... 257/173

* cited by examiner

Primary Examiner—Stephen W. Jackson
(74) Attorney, Agent, or Firm—Townsend and Townsend and Crew LLP

(57) ABSTRACT

The present invention provides an ESD structure that can tolerate voltages at the I/O pin, or pad, higher than the voltage allowed for such technology. More particularly, the present invention provides an electrostatic discharge integrated circuit having a first and second NMOS transistor, a first and second voltage divider, a first and second steady state biasing circuit. The first NMOS transistor sinks electrostatic discharge current from an input/output pad to a ground source, the first NMOS transistor having a drain coupled to the input/output pad, and a gate. The first voltage divider has a node connected to the gate of the first NMOS transistor. The first steady state biasing circuit connects to the gate of the first NMOS transistor. The second NMOS transistor sinks electrostatic discharge current from the input/output pad to the ground source, the second NMOS transistor having a drain coupled to a source of the first NMOS transistor, and a source coupled to the ground source. The second voltage divider has a node connected to a gate of the second NMOS transistor. The second steady state biasing circuit connects to the gate of the second NMOS transistor.

14 Claims, 4 Drawing Sheets

US 6,424,510 B1

ESD STRUCTURE FOR IC WITH OVER-VOLTAGE CAPABILITY AT PAD IN STEADY-STATE

BACKGROUND OF THE INVENTION

The present invention relates to the design of integrated circuit (IC) products in the semiconductor industry and more particularly to an electrostatic discharge (ESD) structure having over-voltage capability at a pad during steady state.

ESD structures, or ESD protection circuits, are important because they divert harmful voltage or current surges, or ESD transients, from potentially vulnerable circuitry and pass such transients to ground (GND). To accommodate for such transients, it is desirable that the ESD structure adapt to operate at varying voltage ranges. This adaptation is important with the advent of low-power consumption products which are generally more vulnerable to ESD transients. For example, gate oxides from 0.35 um technology can generally withstand a maximum gate-to-drain or gate-to-source voltage of 3.6V. The maximum supply voltage (VDD) of ICs in 0.35 um technology is about 3.6V. There is great need for ICs that can tolerate pad voltages greater than VDD, e.g., 5V. Accordingly, if the pad can tolerate 5V, for example, the ESD structure should also tolerate 5V. When an NMOS structure of the prior art is used with ICs made with 0.35 um technology with a single gate-oxide thickness, a 5V input appearing at the pad in normal operation would cause the drain-to-gate voltage of the transistor to be 5V. In time, this would cause gate-oxide failure.

A need therefore remains for an ESD structure for ICs fabricated with sub-micron technology that can tolerate voltages at the I/O pin, or pad, higher than the voltage allowed for such technology. The design must also result in a significant reduction in fabrication costs and an increase in fabrication yield.

SUMMARY OF THE INVENTION

The present invention achieves the above needs and objectives with a new and improved ESD structure that can tolerate voltages at the I/O pin, or pad, higher than the voltage allowed for such technology. More particularly, the present invention provides an electrostatic discharge integrated circuit having a first and second NMOS transistor, a first and second voltage divider, a first and second steady state biasing circuit. The first NMOS transistor sinks electrostatic discharge current from an input/output pad to a ground source, the first NMOS transistor having a drain coupled to the input/output pad, and a gate. The first voltage divider has a node connected to the gate of the first NMOS transistor. The first steady state biasing circuit connects to the gate of the first NMOS transistor. The second NMOS transistor sinks electrostatic discharge current from the input/output pad to the ground source, the second NMOS transistor having a drain coupled to a source of the first NMOS transistor, and a source coupled to the ground source. The second voltage divider has a node connected to a gate of the second NMOS transistor. The second steady state biasing circuit connects to the gate of the second NMOS transistor.

In another embodiment the voltage dividers are capacitive, the voltage dividers having capacitors between the pad and ground, the bias of the voltage dividers being substantially at the mid-point.

In another embodiment, the first steady state biasing circuit ties the gate of the first NMOS transistor to a voltage source such that the drain-gate voltage of the first NMOS transistor remains within gate-oxide tolerance levels.

In another embodiment, the integrated circuit further has a shunting capacitor having a first node coupled to the drain of the second NMOS transistor and a second node coupled to the ground source.

The ESD structure of the present invention can tolerate voltages at the I/O pin, or pad, higher than the voltage allowed for such technology. Another advantage of this design is that the new ESD circuit requires only a single gate-oxide thickness giving significant reduction in fabrication cost and increase in fabrication yield.

The present invention achieves the above purposes and benefits in an inexpensive, uncomplicated, durable, versatile, and reliable circuit and method, inexpensive to manufacture, and readily suited to the widest possible utilization. The present invention achieves these purposes and benefits in the context of known circuit technology and known techniques in the electronic arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

DESCRIPTION OF THE SPECIFIC EMBODIMENTS

Prior Art

Figure 1:
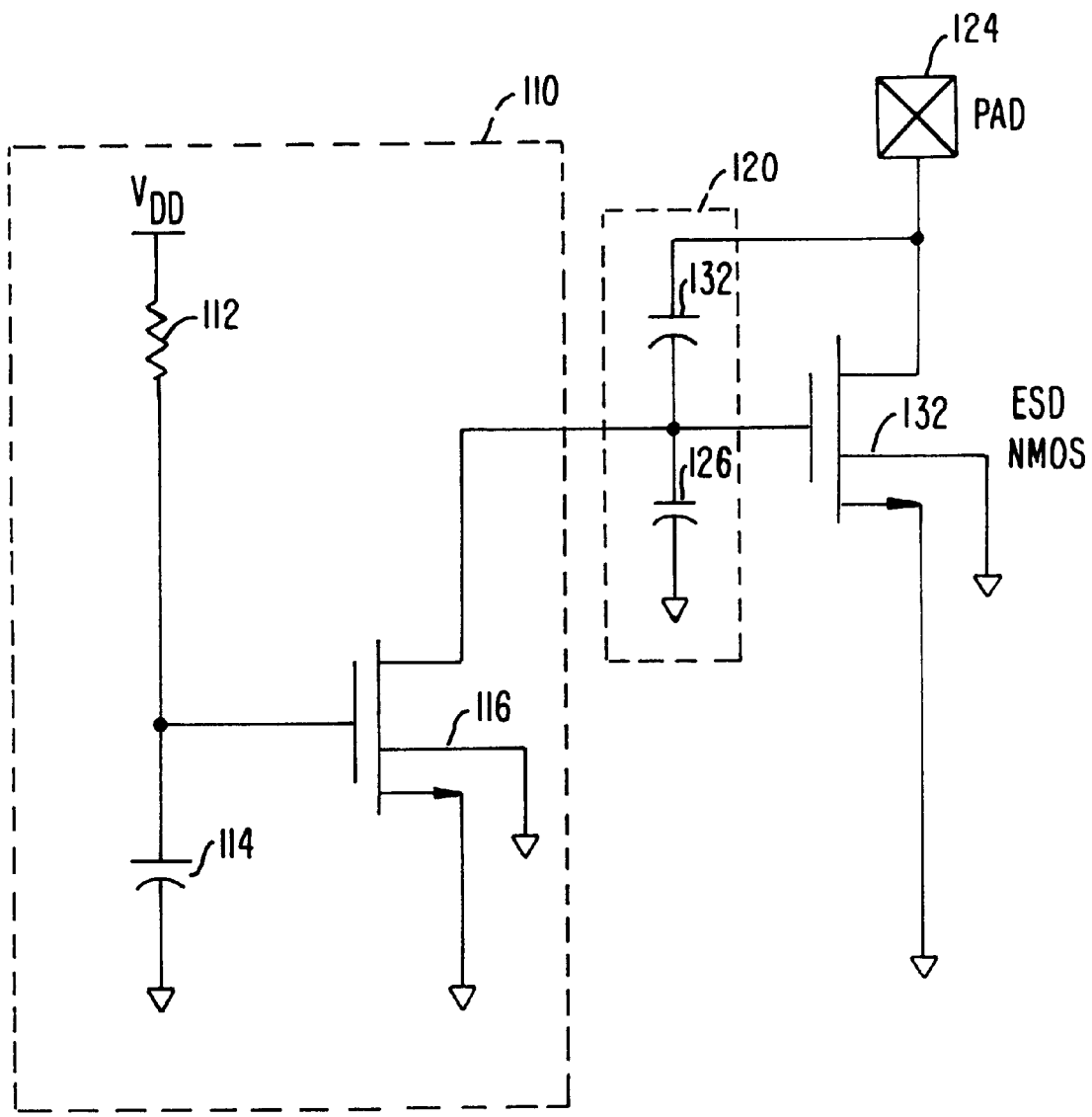
FIG. 1 is a schematic diagram of a prior art ESD structure.

FIG. 1 is a schematic diagram of a prior art ESD structure. This particular ESD structure shown is typical for sub-micron IC circuits. The embodiment shown has a steady-state biasing circuit 110. Steady-state biasing circuit 110 includes a resistor 112 coupled in series to a capacitor 114. Specifically, resistor 112 has a first node coupled to a VDD source (VDD), and a second node coupled to a first node of a capacitor 114 and to a gate of an NMOS transistor 116. Capacitor 114 has a second node coupled to a ground source (GND). NMOS transistor 116 has a drain coupled to a voltage divider 120, and a source coupled to GND.

Voltage divider 120 has a capacitor 122 having a first node coupled to an input/output pad 124, or the pad 124, and a second node coupled to a first node of a capacitor 126 and to the drain of transistor 116. Capacitor 126 has a second node coupled to GND.

An NMOS transistor 132 has a drain coupled to pad 124, a gate coupled to the second node of capacitor 122, and a source coupled to GND. During steady state, the gate is effectively tied to GND. Accordingly, when transistor 116 turns on, transistor 132 turns off. In this particular embodiment, the voltage at the I/O pin, or pad 124, should not exceed VDD. If it exceeds VDD, transistor 132 would have a high drain-to-gate voltage and would thus lead to reliability problems.

Present Invention

Figure 2A:
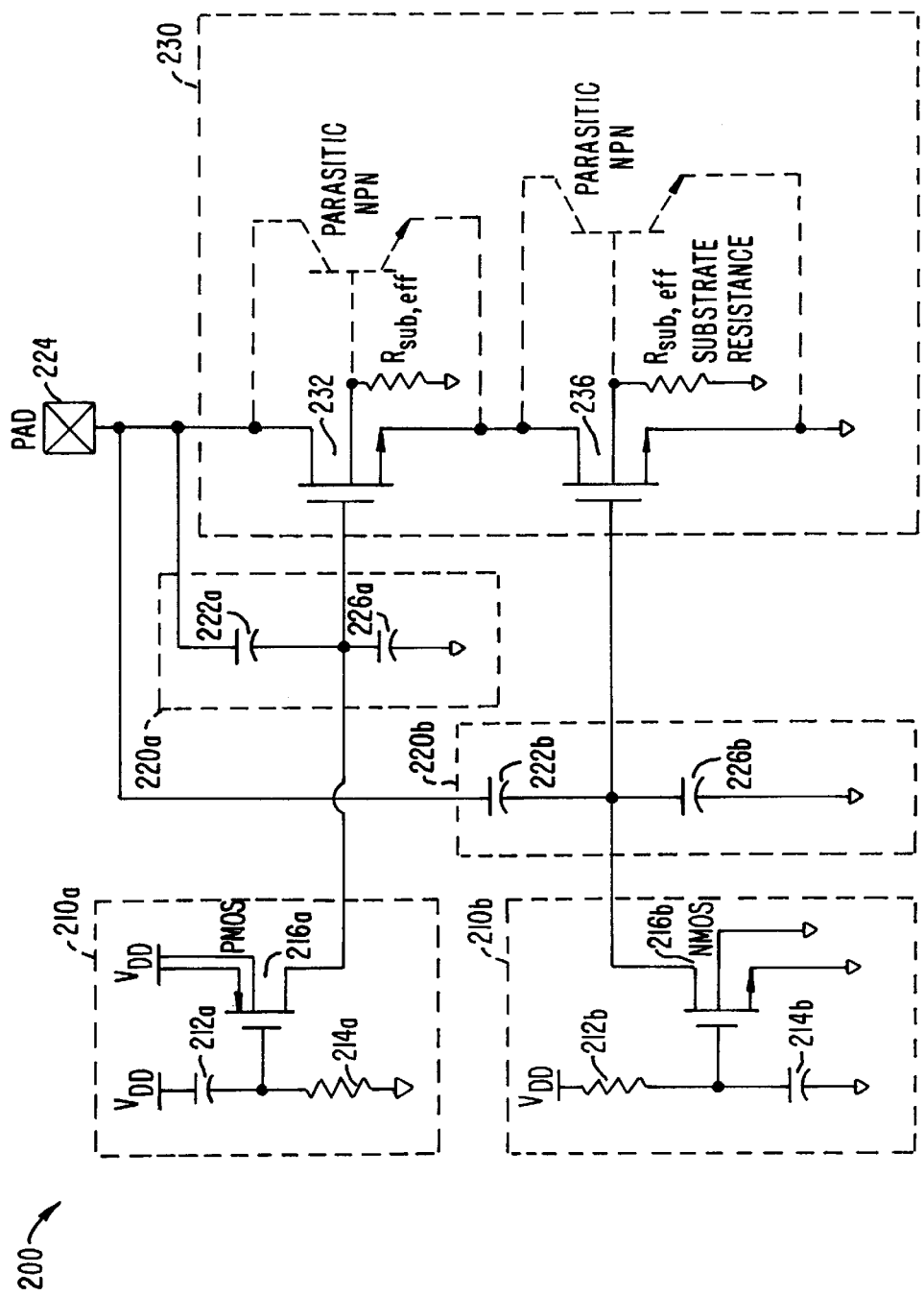
FIG. 2A is a detailed schematic diagram of an embodiment of the ESD structure according to the present invention.

FIG. 2a is a detailed schematic diagram of an embodiment of the ESD structure according to the present invention. This ESD structure of the present invention can tolerate voltages at the I/O pin, or pad 224, higher than VDD, the voltage normally allowed for such technology. This increase in tolerance is due to the added circuits. For example, a steady-state biasing circuit 210a, described below, differs in structure and in function from biasing circuit 110 of the prior art.

The embodiment shown includes steady-state biasing circuit 210a. In this specific embodiment, biasing circuit 210a includes a capacitor 212a coupled in series to a resistor 214a. Specifically, capacitor 212a has a first node coupled to a VDD source (VDD), and a second node coupled to a first node of a resistor 214a and to a gate of a PMOS transistor 216a. Resistor 214a has a second node coupled to a ground source (GND). Transistor 216a has a source coupled to VDD, and a drain coupled to a voltage divider 220a which is described below.

In this specific embodiment, voltage divider 220a has a capacitor 222a having a first node coupled to an input/output pad 224, or the pad 224, and a second node coupled to a first node of a capacitor 226a and to the drain of transistor 216a. Capacitor 226a has a second node coupled to GND. Voltage divider 220a couples to an electrostatic discharge (ESD) circuit 230. While the size of the capacitors can vary, the voltage divider bias is optimized, by conventional means. Typically, the voltage divider is optimized at around the mid-point, such that the gate voltage is about half of the pad voltage. In the specific embodiment shown, circuit 230 includes an NMOS transistor 232 having a drain coupled to pad 224, a gate coupled to voltage divider 220a. In this specific embodiment, the gate of transistor 232 couples to the second node of capacitor 222a.

The embodiment shown also has a steady-state biasing circuit 210b. In this particular embodiment, steady-state biasing circuit 210b includes a resistor 212b coupled in series to a capacitor 214b. Specifically, resistor 212b has a first node coupled to a VDD source (VDD), and a second node coupled to a first node of a capacitor 214b and to a gate of an NMOS transistor 216b. Capacitor 214b has a second node coupled to GND. NMOS transistor 216b has a drain coupled to a voltage divider 220b, and a source coupled to GND.

In this specific embodiment, voltage divider 220b has a capacitor 222b having a first node coupled to pad 224, and a second node coupled to a first node of a capacitor 226b and to the drain of transistor 216b. Capacitor 226b has a second node coupled to GND. Voltage divider 220b couples to ESD circuit 230. While the size of the capacitors can vary, the voltage divider bias is optimized, by conventional means. Typically, the voltage divider is optimized at around the mid-point, such that the gate voltage is about half of the pad voltage. In this specific embodiment, circuit 230 includes an NMOS transistor 236 having a drain coupled to the source of NMOS transistor 232, and a gate coupled to voltage divider 220b. In this specific embodiment, the gate of transistor 236 couples to the second node of capacitor 222b. Transistor 236 has a source coupled to GND.

In operation, steady-state biasing circuit 210a protects transistor 232 from gate-oxide damage when the pad voltage increases above the VDD. Specifically, when the circuit is in DC steady state, biasing circuit 210a is on and keeps transistor 232 on. Also, PMOS transistor 216a is tied to VDD and pulls the gate of transistor 232 up such that the drain-gate voltage of transistor 232 stays within gate-oxide tolerable levels. During transient conditions biasing circuit 210a turns off. Transistor 232 remains on due to voltage divider 220a. When the circuit is in DC steady state, biasing circuit 210b is on and keeps transistor 236 off. During transient conditions biasing circuit 210a turns off and keeps transistor 236 on, due to voltage divider 220b.

In operation, the gate bias of transistor 232 is derived from the pad-voltage through voltage divider 220a. Accordingly, the bias of the gate-voltage of transistor 232 is a fraction of the pad voltage, here, Vpad * (Ccap222a/(Ccap222a+Ccap226a)). Other well-known circuit elements, such as resistors, and the like, can provide the voltage division method. In steady state, the gate of transistor 232 connects to VDD through steady-state biasing circuit 210a shown, or through similar bias scheme.

The gate bias of transistor 236, like that of transistor 232, is derived from the pad-voltage through a capacitor voltage divider 220b, or by any other voltage division method, e.g., using resistors, to bias the gate-voltage to a fraction of the pad-voltage in the dynamic condition, Vpad * (Ccap222b/(Ccap222b+Ccap226b)). While different circuit elements can be used in the voltage divider, capacitors are preferred over resisters. Resistors, if used, must be a high value because they tend to leak current. In steady state, the gate of transistor 236 connects to GND through steady-state biasing circuit 210b shown, or through a similar bias scheme.

Figure 2B:
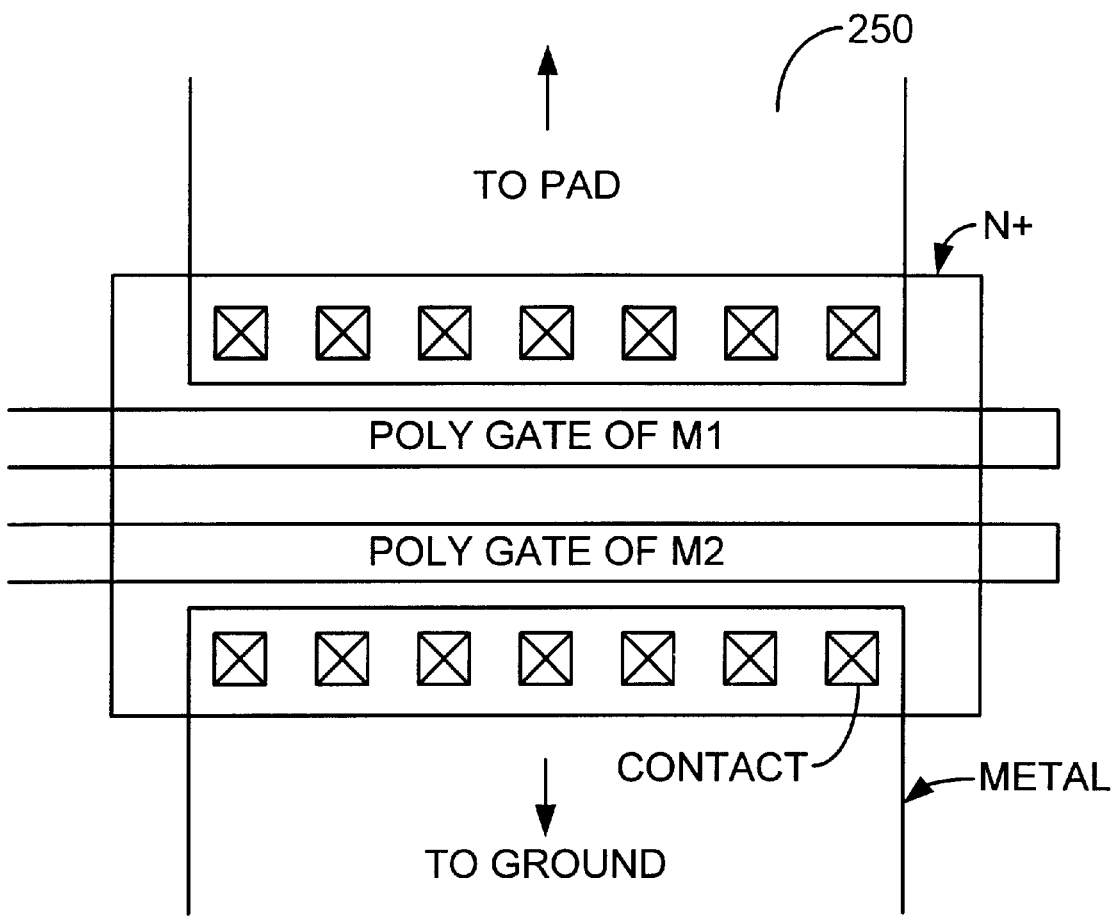
FIG. 2B is a detailed layout diagram of an embodiment of the present invention including a portion of the new ESD structure.

FIG. 2B is a detailed layout diagram of an embodiment of the present invention 250 including a portion of the new ESD structure.

As described above, the gate voltages of transistors 232 and 236 are derived from the pad voltage through voltage dividers 220a and 220b. Accordingly, the gate voltages of transistors 232 and 236 follow the pad voltages. As the pad voltage increases, the gate voltages of transistors 232 and 236 also increase until transistors 232 and 236 turn on and conduct current from the pad to GND. Because transistor 232 has body-bias, the conduction of transistor 232 is weaker than that of transistor 236. Accordingly, most of the pad voltage initially drops across transistor 232. When transistor 236 is in normal conduction mode, i.e., not in avalanche mode, the maximum voltage at the source of transistor 236 would be a threshold-voltage (VTN) below the gate voltage of transistor 232. Thus, in normal conduction mode, the voltage drop across transistor 232 increases up to about 6.5V, and voltage drop across transistor 236 increases up to about 0.7V.

Snap-back in transistor 232 occurs when the drain-to-source voltage of transistor 232 is sufficiently high (Vsnap≡6.5V). Generally, during snap-back, the drain-to-source voltage "snaps back" from a higher voltage (here, about 6.5V) to a lower voltage (here, about 1.5V, or the holding voltage). The snap-back results from a substrate current that is induced by the turning-on of a parasitic NPN transistor (shown in FIG. 2). The snap-back phenomenon is well known and well documented. Here, the snap-back occurs from the drain of transistor 232 to its source, the source being near GND potential (about 0.5V to 0.8V above GND potential). The snap-back voltage also depends on the gate voltage of transistor 232. This dependency occurs because the gate controls the current. A higher gate potential allows more current to flow through the transistor. To maintain a low snap-back voltage, the gate voltage of transistor 232 is optimized to a sufficiently high value. The pad voltage, just before the snap-back of transistor 232, is the snap-back voltage of transistor 232 (Vsnap≡6.5V) plus the voltage drop across transistor 236 (approximately 0.7V) at this current. Thus, the pad voltage is around 7.2V.

Immediately after snap-back in transistor 232, voltage across transistor 232 collapses to approximately its holding voltage (Vholding≡1.5V). Consequently, the voltage across transistor 236 suddenly increases to approximately the pad voltage minus the holding voltage of transistor 232 (approximately 7.2V−1.5V=5.7 V). After the snap-back of transistor 232, its source-to-drain potential increases very slowly as the current increases. The source-to-drain potential increases so slowly that it can be assumed to be almost constant (approximately 1.5V). This voltage approximately equals the holding voltage of transistor 232 (Vholding≡1.5V) in its snap-back characteristics. When the pad voltage is further increased, to 7.5V for example, the drain-to-source voltage across transistor 236 is approximately the pad-voltage minus the holding voltage of transistor 232 (approximately 7.5V−1.5V=6V).

Snap-back occurs in transistor 236 when its drain-to-source voltage is sufficiently high (Vsnap≡6V). During snap-back, it snaps back to its holding voltage (Vholding≡1.5V). As a result, both transistors 232 and 236 go into snap-back mode. When transistors 232 and 236 go into the snap-back mode, they provide high-current discharge capability from the pad to GND. This discharge protects other circuitry from electrostatic discharge (ESD). The size (width/length, or W/L) of the transistors is optimized to carry sufficient ESD current to protect the other circuits. To get the required ESD capability, the capacitor ratios (capacitor 222a/capacitor 226a and capacitor 222b/capacitor 226b) and the sizes of the transistors 232 and 236 are optimized by conventional means. The layout of the ESD structure shown in FIG. 2B enhances the effective parasitic NPN transistor due to the close proximity of transistors 232 and 236, and thus provides efficient discharge of ESD current.

Figure 3:
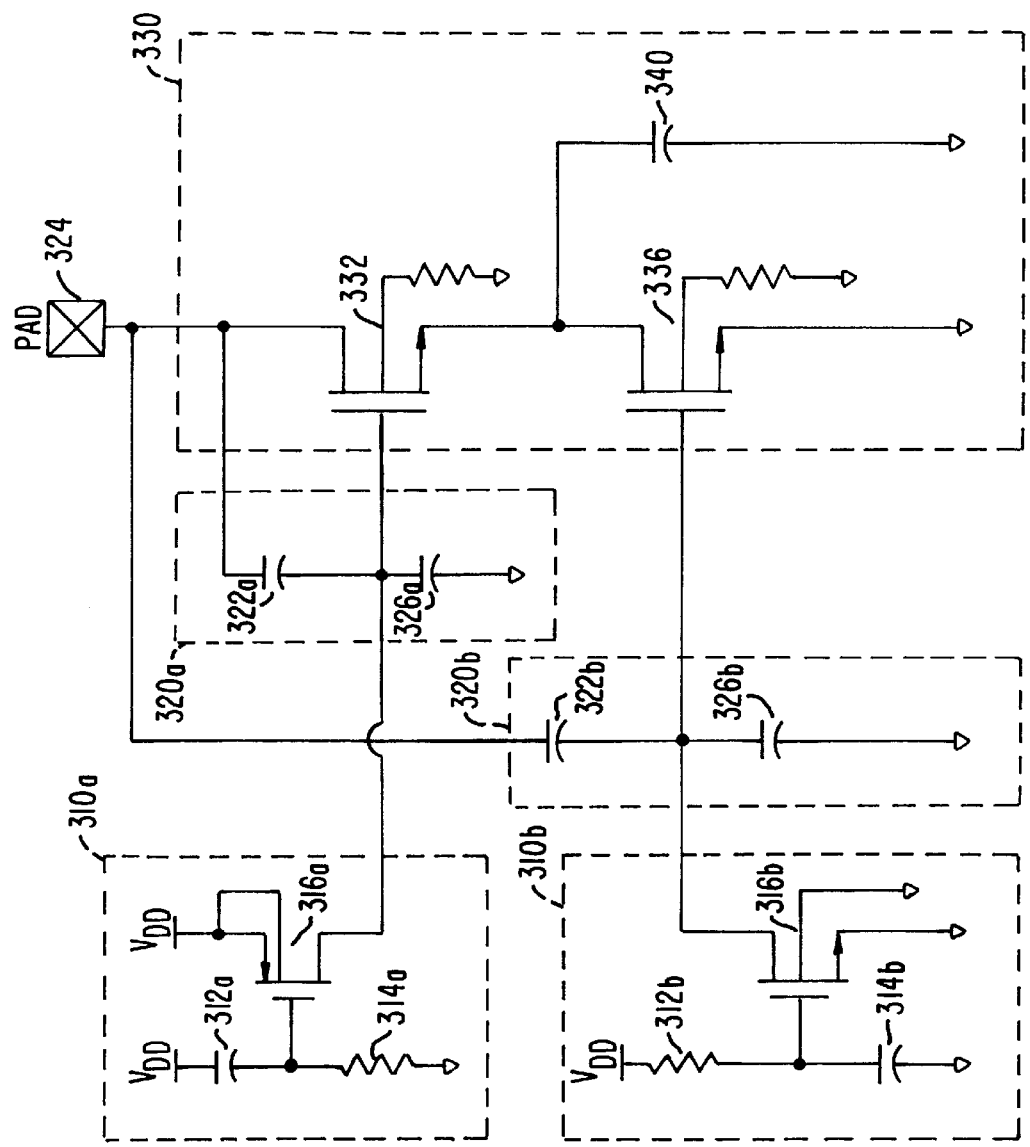
FIG. 3 is a schematic diagram of another embodiment of the ESD structure according to the present invention.

FIG. 3 is a schematic diagram of a second embodiment of the ESD structure according to the present invention. The embodiment shown has a steady-state biasing circuit 310a. In this specific embodiment, circuit 310a includes a capacitor 312a coupled in series to a resistor 314a. Specifically, capacitor 312a has a first node coupled to a VDD source (VDD), and a second node coupled to a first node of a resistor 314a and to a gate of an PMOS transistor 316a. Resistor 314a has a second node coupled to a ground source (GND). Transistor 316a has a drain coupled to VDD, and a source coupled to a voltage divider 320a.

In this specific embodiment, voltage divider 320a has a capacitor 322a having a first node coupled to an input/output pad 324, or the pad 324, and a second node coupled to a first node of a capacitor 326a and to the source of transistor 316a. Capacitor 326a has a second node coupled to GND. Voltage divider 320a is coupled to an electrostatic discharge (ESD) circuit 330. While the size of the capacitors can vary, the voltage divider bias is optimized, by conventional means. Typically, the voltage divider is optimized at around the mid-point, such that the gate voltage is about half of the pad voltage. In this specific embodiment, circuit 330 includes an NMOS transistor 332 having a drain coupled to pad 324, a gate coupled to voltage divider 320a. In this specific embodiment, the gate of transistor 332 couples to the second node of capacitor 322a.

The embodiment shown also has a steady-state biasing circuit 310b. In this specific embodiment, steady-state biasing circuit 310b includes a resistor 312b coupled in series to a capacitor 314b. Specifically, resistor 312b has a first node coupled to a VDD source (VDD), and a second node coupled to a first node of a capacitor 314b and to a gate of an NMOS transistor 316b. Capacitor 314b has a second node coupled to a ground source (GND). NMOS transistor 316b has a drain coupled to a voltage divider 320b and a source coupled to GND.

In this specific embodiment, voltage divider 320b has a capacitor 322b having a first node coupled to pad 324, and a second node coupled to a first node of a capacitor 326b and to the drain of transistor 316b. Capacitor 326b has a second node coupled to GND. Voltage divider 320b is coupled to ESD circuit 330. While the size of the capacitors can vary, the voltage divider bias is optimized, by conventional means. Typically, the voltage divider is optimized at around the mid-point, such that the gate voltage is about half of the pad voltage. In this specific embodiment, circuit 330 includes an NMOS transistor 336 having a drain coupled to the source of transistor 332, and a gate coupled to voltage divider 320b. In this specific embodiment, the gate of transistor 336 couples to the second node of capacitor 322b. Transistor 336 has a source coupled to GND. Capacitor 340 connects between the drain of transistor 336 and GND.

In operation, steady-state biasing circuit 310a protects transistor 332 from gate-oxide damage when the pad voltage increases above the VDD. Specifically, when the circuit is in DC steady state, biasing circuit 310a is on and keeps transistor 332 on. Also, PMOS transistor 316a is tied to VDD and pulls the gate of transistor 232 up such that the drain-gate voltage of transistor 332 stays within gate-oxide tolerable levels. During transient conditions biasing circuit 310a turns off. Transistor 332 remains on due to voltage divider 320a. When the circuit is in DC steady state, biasing circuit 310b is on and keeps transistor 336 off. During transient conditions biasing circuit 310a turns off and keeps transistor 336 on, due to voltage divider 320b.

In operation, capacitor 340 shunts transistor 336 during fast ESD transients. This reduces the effective impedance seen at the source of transistor 332. This also puts the source of transistor 332 at low potential, close to GND, helping transistor 332 to snap-back at a lower voltage (Vsnap≡6V).

Immediately after snap-back in transistor 332, the voltage across transistor 332 collapses to approximately its holding voltage (Vholding≡1.5V). Consequently, the voltage across transistor 336 and capacitor 340 suddenly increases to approximately the pad-voltage minus holding voltage of transistor 332 (approximately 7.2V−1.5V=5.7V).

As the ESD transient slows down, the capacitor 332 diverts decreasing amounts of current. Consequently, increasingly more current flows through transistor 336. After the snap-back of transistor 332, its source-to-drain potential increases very slowly as the current increases. The source-to-drain potential increases so slowly that it can be assumed to be almost constant (≡1.5V). This voltage is approximately equal to the holding voltage of transistor 332 in its snap-back characteristics. When the pad voltage is further increased, the drain-to-source voltage of transistor 336 is approximately the pad-voltage minus the holding voltage of transistor 332 (approximately 7.2V−1.5V=5.7V).

Snap-back in transistor 336 occurs when the voltage across transistor 336 is sufficiently high (Vsnap≡6V). This provides a very efficient sink for the ESD current.

Because the ESD structure of the second embodiment described above can consume a large area, the invention is especially useful with power-supply pads. The input and output pads can be connected to the power supplies by diodes (not shown) from the pad to the power supply. A positive ESD current can be diverted through the diodes from pad to the positive power supply such as VDD, and a negative ESD current can be diverted through the diodes from pad to the negative power supply such as GND.

Conclusion

In conclusion, it can be seen that the present invention provides numerous advantages. Principally, it can tolerate voltages at the I/O pin, or pad, higher than the voltage allowed for such technology. Another advantage of this design is that the new ESD circuit requires only a single gate-oxide thickness giving significant reduction in fabrication cost and increase in fabrication yield.

Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. An electrostatic discharge integrated circuit comprising:
   a first NMOS transistor for sinking electrostatic discharge current from an input/output pad to a ground source, the first NMOS transistor having a drain coupled to the input/output pad, and a gate;
   a first voltage divider having a node connected to the gate of the first NMOS transistor;
   a first steady state biasing circuit connected to the gate of the first NMOS transistor;
   a second NMOS transistor for sinking electrostatic discharge current from the input/output pad to the ground source, the second NMOS transistor having a drain coupled to a source of the first NMOS transistor, and a source coupled to the ground source;
   a second voltage divider having a node connected to a gate of the second NMOS transistor; and
   a second steady state biasing circuit connected to the gate of the second NMOS transistor.

2. The integrated circuit of claim 1 wherein the voltage dividers are capacitive, the voltage dividers having capacitors between the pad and ground, the bias of the voltage dividers being substantially at the mid-point.

3. The integrated circuit of claim 1 wherein the first steady state biasing circuit ties the gate of the first NMOS transistor to a voltage source such that the drain-gate voltage of the first NMOS transistor remains within gate-oxide tolerance levels.

4. The integrated circuit of claim 1 wherein the first voltage divider comprises:
   a first capacitor having a first node coupled to the gate of the first NMOS transistor and a second node coupled to the input/output pad; and
   a second capacitor having a first node coupled to the gate of the first NMOS transistor and a second node coupled to the ground source.

5. The integrated circuit of claim 1 wherein the first steady state biasing circuit comprises:
   a third capacitor coupled to a voltage source;
   a first resistor coupled between a third capacitor and ground; and
   a PMOS transistor having a source coupled to the voltage source, a gate coupled to a first node of the third capacitor and to a first node of the first resistor, and a drain coupled to the gate of the first NMOS transistor.

6. The integrated circuit of claim 1 wherein the second voltage divider comprises:
   a fourth capacitor having a first node coupled to the gate of the second NMOS transistor and a second node coupled to the input/output pad; and
   a fifth capacitor having a first node coupled to the gate of the second NMOS transistor and a second node coupled to the ground source.

7. The integrated circuit of claim 1 wherein the second steady state biasing circuit comprises:
   a second resistor coupled to a voltage source;
   a sixth capacitor coupled between a second resistor and ground; and
   a third NMOS transistor having a drain coupled to the gate of the second NMOS transistor, a gate coupled to a first node of the second resistor and to a first node of the sixth capacitor, and a source coupled to the ground source.

8. The integrated circuit of claim 1 further comprising a shunting capacitor having a first node coupled to the drain of the second NMOS transistor and a second node coupled to the ground source.

9. An electrostatic discharge integrated circuit comprising:
   a first NMOS transistor for sinking electrostatic discharge current from an input/output pad to a ground source, the first NMOS transistor having a drain coupled to the input/output pad, and a gate;
   a first voltage divider having a node connected to the gate of the first NMOS transistor;
   a first steady state biasing circuit connected to the gate of the first NMOS transistor;
   a second NMOS transistor for sinking electrostatic discharge current from the input/output pad to the ground source, the second NMOS transistor having a drain coupled to a source of the first NMOS transistor, and a source coupled to the ground source;
   a second voltage divider having a node connected to a gate of the second NMOS transistor; and
   a second steady state biasing circuit connected to the gate of the second NMOS transistor; and
   a shunting capacitor having a first node coupled to the drain of the second NMOS transistor and a second node coupled to the ground source.

10. The integrated circuit of claim 9 wherein the first voltage divider comprises:
    a first capacitor having a first node coupled to the gate of the first NMOS transistor and a second node coupled to the input/output pad; and
    a second capacitor having a first node coupled to the gate of the first NMOS transistor and a second node coupled to the ground source.

11. The integrated circuit of claim 9 wherein the first steady state biasing circuit comprises:
    a third capacitor coupled to a voltage source;
    a first resistor coupled between a third capacitor and ground; and
    a PMOS transistor having a source coupled to the voltage source, a gate coupled to a first node of the third capacitor and to a first node of the first resistor, and a drain coupled to the gate of the first NMOS transistor.

12. The integrated circuit of claim 9 wherein the second voltage divider comprises:
    a fourth capacitor having a first node coupled to the gate of the second NMOS transistor and a second node coupled to the input/output pad; and a fifth capacitor having a first node coupled to the gate of the second NMOS transistor and a second node coupled to the ground source.

13. The integrated circuit of claim 9 wherein the second steady state biasing circuit comprises:

a second resistor coupled to a voltage source;

a sixth capacitor coupled between a second resistor and ground; and a third NMOS transistor having a drain coupled to the gate of the second NMOS transistor, a gate coupled to a first node of the second resistor and to a first node of the sixth capacitor, and a source coupled to the ground sources.

14. An electrostatic discharge integrated circuit comprising:

a first NMOS transistor for sinking electrostatic discharge current from an input/output pad to a ground source, the first NMOS transistor having a drain coupled to the input/output pad, and a gate;

a first voltage divider having a first capacitor having a first node coupled to the gate of the first NMOS transistor and a second node coupled to the input/output pad, and a second capacitor having a first node coupled to the gate of the first NMOS transistor and a second node coupled to the ground source;

a second voltage divider having a fourth capacitor having a first node coupled to the gate of the second NMOS transistor and a second node coupled to the input/output pad, a fifth capacitor having a first node coupled to the gate of the second NMOS transistor and a second node coupled to the ground source;

a first steady state biasing circuit comprising a third capacitor coupled to a voltage source, a first resistor coupled between a third capacitor and ground, and a PMOS transistor having a source coupled to the voltage source, a gate coupled to a first node of the third capacitor and to a first node of the first resistor, and a drain coupled to the gate of the first NMOS transistor;

a second NMOS transistor for sinking electrostatic discharge current from the input/output pad to the ground source, the second NMOS transistor having a drain coupled to a source of the first NMOS transistor, a gate, and a source coupled to the ground source; and a second steady state biasing circuit comprising a second resistor coupled to a voltage source, a sixth capacitor coupled between a second resistor and ground, and a third NMOS transistor having a drain coupled to the gate of the second NMOS transistor, a gate coupled to a first node of the second resistor and to a first node of the sixth capacitor, and a source coupled to the ground source.

* * * * *